US008237418B1

(12) United States Patent
Krishna

(10) Patent No.: US 8,237,418 B1

(45) Date of Patent: Aug. 7, 2012

(54) VOLTAGE REGULATOR USING FRONT AND BACK GATE BIASING VOLTAGES TO OUTPUT STAGE TRANSISTOR

(75) Inventor: Damaraji Naga Radha Krishna, LaJolla, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 855 days.

(21) Appl. No.: 12/195,912

(22) Filed: Aug. 21, 2008

Related U.S. Application Data

(60) Provisional application No. 60/976,400, filed on Sep. 28, 2007.

(51) Int. Cl.
*G05F 1/00* (2006.01)
*H03K 3/01* (2006.01)

(52) U.S. Cl. ........................................ 323/273; 327/534

(58) Field of Classification Search .................. 323/273; 327/534

See application file for complete search history.

(56) References Cited

U.S. PATENT DOCUMENTS

| | | | | |
|---|---|---|---|---|
| 7,106,042 | B1 * | 9/2006 | Jackson | 323/316 |
| 7,199,565 | B1 * | 4/2007 | Demolli | 323/273 |
| 7,298,117 | B2 * | 11/2007 | Hasegawa et al. | 323/222 |
| 7,362,079 | B1 * | 4/2008 | Maheedhar et al. | 323/269 |
| 7,592,841 | B2 * | 9/2009 | Kapoor | 326/121 |
| 7,714,553 | B2 * | 5/2010 | Lou | 323/276 |
| 2005/0057234 | A1 * | 3/2005 | Yang et al. | 323/273 |
| 2008/0122519 | A1 * | 5/2008 | Nowak | 327/534 |

* cited by examiner

*Primary Examiner* — Adolf Berhane
*Assistant Examiner* — Emily Pham

(57) ABSTRACT

A replica biased voltage regulator circuit and method of load regulation are provided herein. According to one embodiment, the replica biased voltage regulator circuit includes an operational amplifier and a comparator, wherein outputs of the operational amplifier and comparator are respectively and simultaneously supplied to a front gate and a back gate of an output stage transistor included for regulating an output voltage generated by the replica biased voltage regulator circuit.

20 Claims, 2 Drawing Sheets

VOLTAGE REGULATOR USING FRONT AND BACK GATE BIASING VOLTAGES TO OUTPUT STAGE TRANSISTOR

This Non Provisional application claims priority to and benefit of U.S. provisional patent application No. 60/976,400, filed Sep. 28, 2007.

TECHNICAL FIELD

This disclosure relates to electronic circuits and, more particularly, to voltage regulators.

BACKGROUND

Voltage regulator circuits serve numerous purposes in integrated circuit devices. One such purpose can be as a regulated internal power supply voltage for sections of the integrated circuit device. For example, a voltage regulator may be used to supply a power supply voltage to a memory cell array within a memory device, such as a dynamic random access memory (DRAM) or static RAM (SRAM). Many types of voltage regulators currently exist.

A replica biased voltage regulator represents one type of voltage regulator where a voltage established in one portion of a circuit (e.g., one leg) is replicated, typically by larger sized devices, to present an output voltage to a load. The output voltage is regulated by having it track the replica voltage as close as possible. Many replica biased voltage regulators use active (dynamic) line regulation and passive (static) load regulation. Although such approaches may achieve a relatively good high frequency transient response, they often do so at the expense of poor DC load regulation.

SUMMARY

An embodiment describes a circuit including a replica biased voltage regulator comprising an operational amplifier and a comparator, wherein outputs of the operational amplifier and a comparator are respectively and simultaneously supplied to a front gate and a back gate of an output stage transistor for regulating an output voltage generated by the replica biased voltage regulator.

Figure 1:
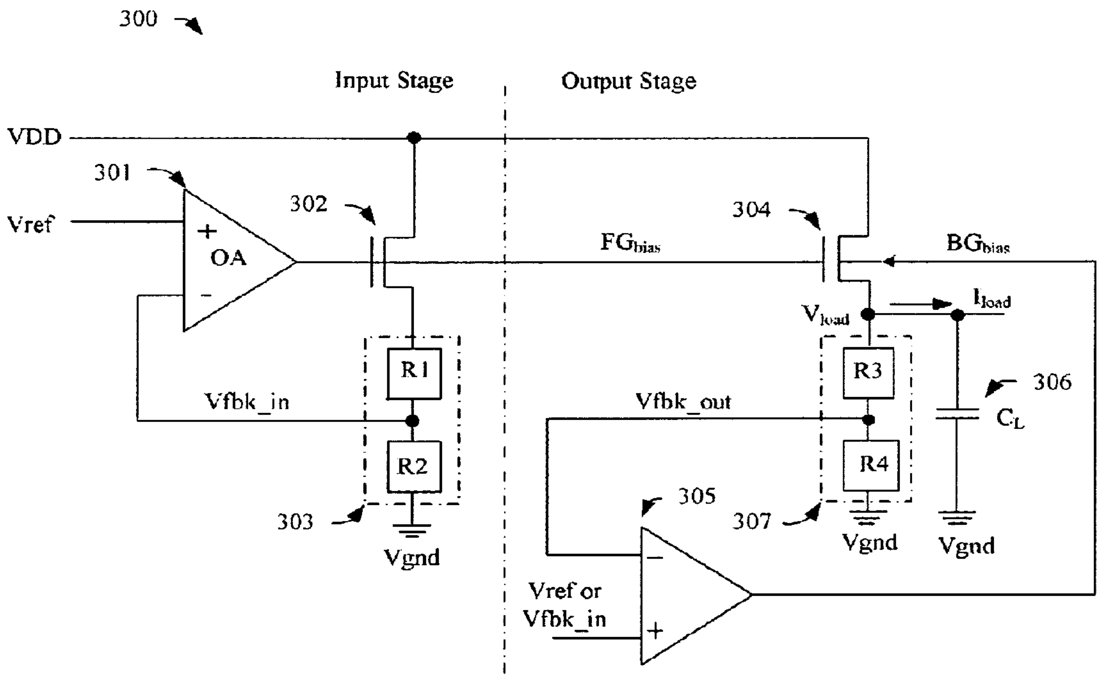
FIG. 1 is a circuit schematic diagram illustrating a replica biased voltage regulator that solves load regulation, in accordance with an embodiment of the present invention, by supplying bias voltages to the front and back gates of the transistor included within the output stage for generating the regulator output voltage.

While the disclosure is susceptible to various modifications and alternative forms, specific embodiments thereof are shown by way of example in the drawings and will herein be described in detail. It should be understood, however, that the drawings and detailed description thereto are not intended to limit the embodiments of the invention to the particular form disclosed, but on the contrary, the intention is to cover all modifications, equivalents and alternatives falling within the spirit and scope thereof.

DETAILED DESCRIPTION

According to an embodiment, a circuit including a replica biased voltage regulator is provided herein. The replica biased voltage regulator may generally include an operational amplifier (opamp) and a comparator. As set forth in more detail below, outputs of the opamp and comparator may be respectively and simultaneously supplied to a front gate and a back gate of an output stage transistor included for regulating an output voltage generated by the replica biased voltage regulator.

For example, the replica biased voltage regulator may include an input stage and an output stage. The input stage of the replica biased voltage regulator may include an input stage transistor and the opamp. The input stage transistor may be coupled in series with a first voltage divider network between a power supply node and ground. The opamp may be coupled to provide an input feedback loop with the input stage transistor and the first voltage divider network. For example, inputs of the opamp may be coupled for comparing a feedback voltage provided by the first divider network to a first voltage (e.g., a reference voltage). The output of the opamp may be supplied to the front gates of the input stage transistor and the output stage transistor included within the output stage of the replica biased voltage regulator.

The output stage of the replica biased voltage regulator may include a load circuit, in addition to the output stage transistor and the comparator mentioned above. The output stage transistor may be coupled in series with a second voltage divider network between the power supply node and ground. The load circuit may be coupled in parallel with the second voltage divider network at an output node of the voltage regulator circuit. In one embodiment, the load circuit may comprise a load capacitor.

The comparator may be coupled to provide an output feedback loop with the second voltage divider network and the back gate of the output stage transistor. For example, inputs of the comparator may be coupled for comparing a feedback voltage provided by the second voltage divider network to a second voltage (e.g., the reference voltage or the feedback voltage provided by the first voltage divider network). As noted above, the output of the comparator may be supplied to the back gate of the output stage transistor. The comparator may be implemented with a linear amplifier, in one embodiment, and a non-linear voltage comparator in another embodiment.

The voltage regulator circuit and method described herein operates the opamp and the comparator in tandem, so that the first and second bias voltages are simultaneously supplied to the front and back gates of the output transistor. In other words, the circuit and method described herein adjusts the back gate voltage of the output transistor to account for variations in current load conditions. Other embodiments of the disclosed circuit and method may provide increased stability, reduced power and area consumption, and a minimum power supply specification.

A replica biased voltage regulator circuit and method are provided herein. As set forth below, the disclosed circuit and method employs a front gate and a back gate regulation scheme. For example, the voltage regulator circuit described herein utilizes an operational amplifier (opamp) and a comparator, which operate in tandem to regulate the output voltage provided by the voltage regulator circuit. The opamp is coupled for supplying a first bias voltage to the front gate of an output transistor to regulate the output voltage generated by the voltage regulator circuit. The comparator is coupled for supplying a second bias voltage to the back gate of the output transistor. The bias voltage supplied to the back gate modulates the back gate voltage of the output transistor to account for variations in loading conditions.

A replica biased voltage regulator circuit according to one embodiment of the invention is illustrated in FIG. 1 and designated with reference numeral 300. As shown in FIG. 1, an input stage of the replica biased voltage regulator circuit 300 comprises an operational amplifier (OA) 301, an input stage transistor 302 and a first voltage divider network 303. In one embodiment, the opamp 301 may be implemented with a differential amplifier. The input stage transistor 302 may be implemented with an N-type Metal Oxide Silicon (NMOS) device or an N-type Field Effect Transistor (NFET) device. The first voltage divider network 303 may be implemented with active or passive devices, and may include any configuration deemed appropriate for generating a feedback voltage (Vfbk_in) in the input stage.

The opamp 301, input stage transistor 302, and first voltage divider network 303 provide a first (input) feedback loop for regulating the output voltage ($V_{load}$) generated by the voltage regulator circuit 300. In the embodiment of FIG. 3, the input terminals of the opamp 301 are coupled for receiving a reference voltage (Vref) from a voltage source and a feedback voltage (Vfbk_in) from the first voltage divider network 303. In one example, the reference voltage may be generated by a band gap reference (BGR) voltage source. However, one skilled in the art would understand how the reference voltage may be obtained from an alternative voltage source without departing from the scope of embodiments of the invention. As described in more detail below, the opamp 301 generates a first bias voltage ($FG_{bias}$), which is fed to the front gates of the input stage transistor 302 and the output stage transistor 304 for regulating the output voltage ($V_{load}$) provided the voltage regulator circuit 300.

Additional load regulation is provided in the output stage of the replica biased voltage regulator circuit 300. For example, the output stage may include an output stage transistor 304, a comparator 305, a second voltage divider network 307 and a load capacitor 306. The output stage transistor 304 may be implemented with an N-type Metal Oxide Silicon (NMOS) device or an N-type Field Effect Transistor (NFET) device. The second voltage divider network 307 may be implemented with active or passive devices, and may include any configuration deemed appropriate for generating a feedback voltage (Vfbk_out) in the output stage. In some embodiments, the comparator 305 may be implemented with a linear amplifier (e.g., a single-stage operational amplifier). In other embodiments, the comparator 305 may be implemented with a non-linear voltage comparator having hysteresis. Reasons for selecting a particular embodiment will be discussed in more detail below.

The comparator 305, output stage transistor 304, and second voltage divider network 307 provide a second (output) feedback loop modulating the back gate voltage of the output stage transistor to account for variations in loading conditions. In the embodiment of FIG. 1, the input terminals of the comparator 305 are coupled for receiving a reference voltage (Vref) from a reference voltage source (e.g., the BGR voltage source mentioned above) and a feedback voltage (Vfbk_out) from the second voltage divider network 307. In an alternative embodiment, the feedback voltage (Vfbk_in) from the first divider network 303 may be supplied to the comparator 305 in lieu of the reference voltage. Regardless of the particular inputs supplied thereto, the comparator 305 may be included within the voltage regulator circuit for generating a second bias voltage ($BG_{bias}$), which is fed to the back gate of the output stage transistor 304. As described in more detail below, the output feedback loop modulates the back gate voltage of the output stage transistor to account for load variations.

Load regulation is provided in the embodiment of FIG. 1 by operating operational amplifier 301 and comparator 305 in tandem. The opamp 301 compares the input feedback voltage (Vfbk_in) to the reference voltage (Vref) and generates a first bias voltage ($FG_{bias}$) in response thereto. The first bias voltage ($FG_{bias}$) is supplied to the front gate of the output transistor 304 for controlling current flow through the load devices (e.g., load capacitor 306 and divider network 307) and generating an output voltage ($V_{load}$) at the source terminal of the output transistor. However, the output voltage ($V_{load}$) generated by the voltage regulation circuit 300 may be highly dependant on load variations. For instance, the output voltage ($V_{load}$) increases during low load conditions ($I_{load}$ being low) and decreases during high load conditions ($I_{load}$ being high).

During low load conditions, the regulator output voltage ($V_{load}$) increases, often exceeding the reference voltage (Vref) supplied to the operational amplifier 301 (and possibly comparator 305). The comparator 305 compares a fraction of the regulator output voltage (denoted Vfbk_out) to a fraction of the reference voltage (or, alternatively, the feedback voltage, Vfbk_in, from the input stage) and generates a second bias voltage ($BG_{bias}$) in response thereto. The second bias voltage ($BG_{bias}$) is supplied to the back gate of the output stage transistor at the same time that the front gate bias ($FG_{bias}$) is being applied.

Due to the negative feedback provided by comparator 305, the bias voltage ($BG_{bias}$) supplied to the back gate of the output transistor 304 decreases as the regulator output voltage ($V_{load}$) increases. This increases the threshold voltage of the output transistor (due to the body effect), thereby reducing the regulator output voltage ($V_{load}$) considerably. The opposite would hold true if the regulator output voltage ($V_{load}$) were to decrease under conditions of high loading. During high current load conditions, for example, the bias voltage ($BG_{bias}$) supplied to the back gate of the output transistor 304 would increase, thereby reducing the threshold voltage of the output transistor (due to the body effect) and increasing the regulator output voltage ($V_{load}$).

The load regulation scheme described herein utilizes the body effect to prevent the output voltage ($V_{load}$) from reacting to load variations. As current loads ($I_{load}$) decrease, the comparator 305 decreases the back gate voltage supplied to the output transistor 304 to increase the transistor threshold voltage and decrease the regulator output voltage ($V_{load}$). An increase in current load ($I_{load}$) causes the back gate voltage supplied to the output transistor 304 to increase, thereby decreasing the transistor threshold voltage and increasing the regulator output voltage ($V_{load}$).

The load regulation scheme described herein provides many benefits over other load regulation schemes, which use switched dummy loads or current conveyor circuits. For example, the disclosed load regulation scheme reduces power consumption by avoiding the use of dummy loads. The load regulation scheme described herein also avoids the use of stacked devices and large output devices. This significantly reduces the area and minimum supply voltage (VDD) requirements, and makes the regulator circuit suitable for operating at low voltage supply.

Furthermore, the load regulation scheme described herein may overcome stability concerns. As noted above, voltage regulator circuit 300 provides both an input loop and an output loop. Loop stability can be maintained in a variety of ways, depending on the manner in which the opamp and comparator are implemented. For opamp 301, loop stability can be maintained by adding a capacitance (not shown) on the front gate of input 302 and output 304 transistors. If comparator 305 is implemented with a linear amplifier, loop stability can be maintained by the load capacitance 306 included within the output stage. If a switching regulator or non-linear voltage comparator is used in lieu of a linear amplifier, the hysteresis provided by the comparator ensures the stability of the loop.

The choice between a linear amplifier and a non-linear voltage comparator for 305 depends on whether one wishes to provide an analog (linear opamp) or digital (comparator) back gate voltage to the output transistor. In an embodiment, a digital voltage comparator may be selected to provide a good transient step response (which the comparator would use to respond to sudden load fluctuations). However, voltage comparators are often plagued with latch-up concerns (due to sudden injection of current into the bulk of the output transistor 304) and noise concerns. To avoid such concerns, an analog operational amplifier may be chosen in other embodiments of the invention.

Figure 2:
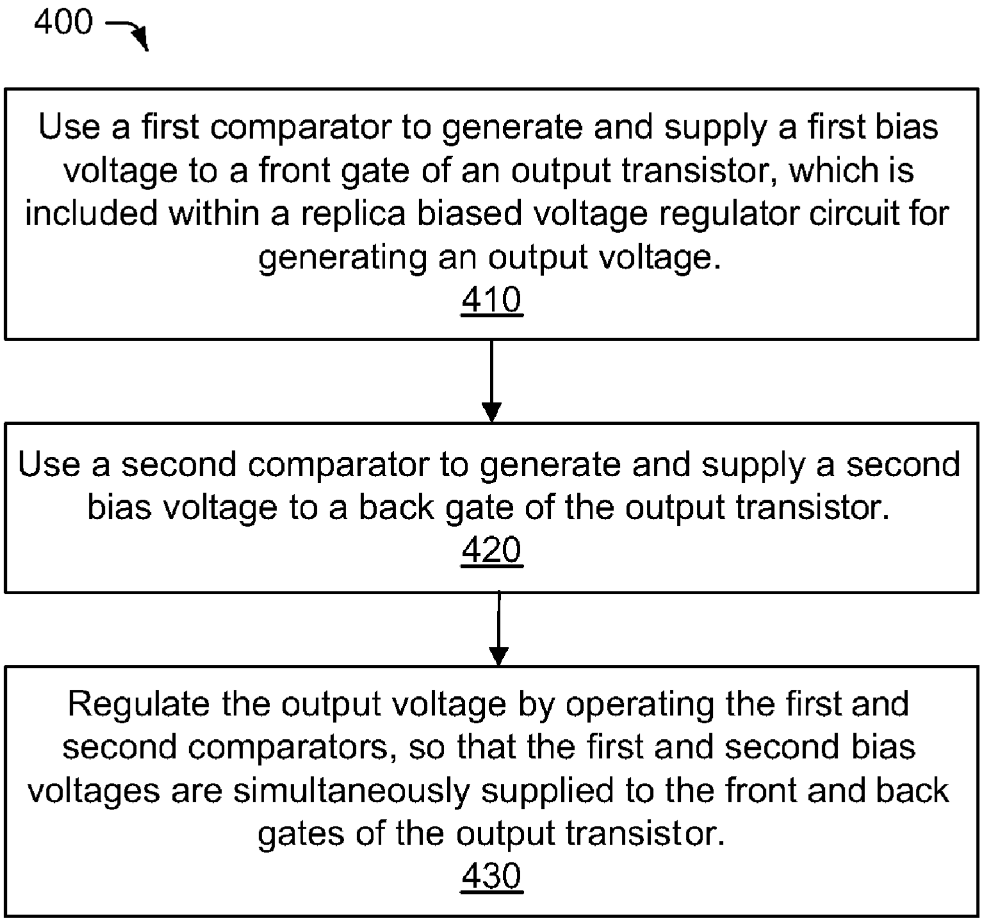
FIG. 2 is a flow chart diagram illustrating an embodiment of a method in a replica biased voltage regulator circuit.

An embodiment of a method 400 of implementing a replica biased voltage regulator circuit is illustrated in FIG. 2. In some cases, the method may use an operational amplifier to generate and supply a first bias voltage ($FG_{bias}$) 410 to a front gate of an output transistor and a comparator to generate and supply a second bias voltage ($BG_{bias}$) 420 to a back gate of the output transistor. As noted above, the output transistor may be included within an output stage of the replica biased voltage regulator circuit for generating an output voltage ($V_{load}$). In order to regulate the output voltage, the method may operate the opamp and comparator in tandem 430, so that the first and second bias voltages are simultaneously supplied to the front and back gates of the output transistor.

In general, the method described herein combines a front gate regulation scheme with a back gate regulation scheme, which modulates the back gate voltage of the output transistor to account for load variations.

In an embodiment, the operational amplifier may generate the first bias voltage ($FG_{bias}$) by comparing a reference voltage (Vref) to a first feedback voltage (Vfbk_in) provided by an input feedback loop. As indicated above, the operational amplifier may be implemented with a differential amplifier.

In an embodiment, the comparator may generate the second bias voltage ($BG_{bias}$) by comparing the reference voltage (Vref) to a second feedback voltage (Vfbk_out) provided by an output feedback loop. In another embodiment, the feedback voltage (Vfbk_int) provided by the input feedback loop may be supplied to the comparator in lieu of the reference voltage.

As indicated above, the comparator may be implemented in a variety of ways. In an embodiment, the comparator may comprise a linear amplifier. In such an embodiment, the method may maintain stability in the output feedback loop by means of a load capacitor coupled to an output node of the voltage generator circuit. In another embodiment, the comparator may comprise a non-linear voltage comparator. In such an embodiment, the hysteresis included within the voltage comparator may be responsible for maintaining stability in the output feedback loop.

Embodiments of the present invention are well suited to performing various other methods or variations thereof, and in a sequence other than that depicted and/or described herein. For purposes of clarity, many of the details of the circuit and method of load regulation in replica biased voltage regulators and the methods of designing and manufacturing the same that are widely known and are not relevant to the embodiments of the present invention have been omitted from the description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A circuit comprising:
- a replica biased voltage regulator;
- an operational amplifier; and
- a comparator;
- wherein outputs of the operational amplifier and the comparator are configured to be respectively and simultaneously supplied to a front gate and a back gate of an output stage transistor to regulate an output voltage generated by the replica biased voltage regulator by causing the bias voltage on the back gate of the output transistor to vary to maintain the output voltage at a regulated value.

2. The circuit of claim 1, wherein an input stage of the replica biased voltage regulator comprises:
- an input stage transistor coupled in series with a first voltage divider network between a power supply node and ground; and
- the operational amplifier, inputs of the operational amplifier coupled to compare a feedback voltage provided by the first voltage divider network to a first voltage, the output of the operational amplifier commonly gated to the input stage transistor and the output stage transistor.

3. The circuit of claim 2, wherein the operational amplifier is coupled to provide an input feedback loop with the input stage transistor and the first divider network.

4. The circuit of claim 2, wherein an output stage of the replica biased voltage regulator comprises:
- the output stage transistor coupled in series with a second voltage divider network between the power supply node and ground;
- a load circuit coupled in parallel with the second voltage divider network at an output node of the voltage regulator circuit; and
- the comparator, inputs of the comparator coupled to compare a feedback voltage provided by the second voltage divider network to a second voltage.

5. The circuit of claim 4, wherein the load circuit comprises a load capacitor.

6. The circuit of claim 4, wherein the comparator is coupled to provide an output feedback loop with the second voltage divider network and the back gate of the output stage transistor.

7. The circuit of claim 4, wherein the comparator is selected from a group comprising a linear amplifier and a non-linear voltage comparator.

8. The circuit of claim 4, wherein the first and second voltages each comprise a reference voltage supplied from a reference voltage source.

9. The circuit of claim 4, wherein the first voltage comprises a reference voltage supplied from a reference voltage source, and wherein the second voltage comprises the feedback voltage provided by the first voltage divider network.

10. The circuit of claim 4, wherein at least one of the first and second voltages comprises a reference voltage supplied from a band gap reference voltage source.

11. A method of load regulation in a replica biased voltage regulator circuit, the method comprising:

applying an operational amplifier output as a first bias voltage to a front gate of an output transistor, which is included within the replica biased voltage regulator circuit for generating an output voltage;

applying a comparator output as a second bias voltage to a back gate of the output transistor; and regulating the output voltage by operating the operational amplifier and the comparator, so that the first and second bias voltages are simultaneously supplied to the front and back gates of the output transistor whereby the bias voltage on the back gate is forced to vary to maintain the output voltage at a regulated value.

12. The method of claim 11, wherein regulating supplies the second bias voltage to the back gate of the output transistor to adjust a threshold voltage of the output transistor.

13. The method of claim 11, wherein using the operational amplifier comprises generating the first bias voltage by comparing a reference voltage to a first feedback voltage provided by an input feedback loop.

14. The method of claim 13, wherein using the comparator comprises generating the second bias voltage by comparing the reference voltage to a second feedback voltage provided by an output feedback loop.

15. The method of claim 13, wherein using the comparator comprises generating the second bias voltage by comparing the first feedback voltage to a second feedback voltage provided by an output feedback loop.

16. The method of claim 15, wherein the comparator comprises a linear amplifier.

17. The method of claim 16, further comprising maintaining stability in the output feedback loop by means of a load capacitor coupled to an output node of the replica biased voltage generator circuit.

18. The method of claim 15, wherein the comparator comprises a non-linear voltage comparator.

19. The method of claim 18, further comprising maintaining stability in the output feedback loop by means of hysteresis included within the non-linear voltage comparator.

20. A method, comprising: regulating an output voltage of a voltage regulator circuit comprising an output transistor, an operational amplifier, and a comparator, by providing a first bias voltage from the operational amplifier to a front gate of an output transistor of the voltage regulator, and simultaneously with providing the first bias voltage to the output transistor, providing a second bias voltage from the comparator to a back gate of the output transistor to cause the second bias voltage to vary to maintain the output voltage at a regulated value.

* * * * *